US012669543B2

(12) United States Patent
Kroener et al.

(10) Patent No.: US 12,669,543 B2
(45) Date of Patent: Jun. 30, 2026

---

(54) METHOD AND DEVICE FOR ADJUSTING MODEL PARAMETERS OF AN ELECTROCHEMICAL BATTERY MODEL OF A DEVICE BATTERY DURING A CHARGING PROCESS

(71) Applicant: Robert Bosch GmbH, Stuttgart (DE)

(72) Inventors: Christoph Kroener, Freiberg am Neckar (DE); Christoph Woll, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 518 days.

(21) Appl. No.: 18/176,506

(22) Filed: Mar. 1, 2023

(65) Prior Publication Data

US 2023/0280405 A1 Sep. 7, 2023

(30) Foreign Application Priority Data

Mar. 1, 2022 (DE) .......................... 102022202084.7

(51) Int. Cl.
*G01R 31/367* (2019.01)
*H01M 10/42* (2006.01)
(Continued)

(52) U.S. Cl.
CPC ........ *G01R 31/367* (2019.01); *H01M 10/425* (2013.01); *H01M 10/441* (2013.01);
(Continued)

(58) Field of Classification Search
CPC . G01R 31/367; H02J 7/00711; H01M 10/425; H01M 10/441; H01M 10/445; H01M 2010/4278
See application file for complete search history.

(56) References Cited

U.S. PATENT DOCUMENTS

2013/0317771 A1* 11/2013 Laskowsky ......... H01M 10/482
702/63
2016/0023566 A1 1/2016 Lee
(Continued)

FOREIGN PATENT DOCUMENTS

CA 3154716 A1 * 4/2021 ........... G01R 31/392
DE 102017103617 A1 8/2018
(Continued)

*Primary Examiner* — Shelby A Turner
*Assistant Examiner* — Xiuqin Sun
(74) *Attorney, Agent, or Firm* — Michael Best & Friedrich LLP

(57) ABSTRACT

A method for adjusting a parameter of a model of a battery, including providing a temporal operating variable profile of a plurality of operating variables for a time period, and modelling a profile of one of the operating variables using the model based on an operating variable of the provided operating variable profile within the time period. The method includes determining an operating state of the battery when the modeled operating variable deviates from the corresponding operating variable by more than a threshold value during the time period. The method includes performing a charging process, wherein, in the presence of the operating state, a current pulse or a voltage pulse of a specified height and a specified duration is superimposed on a charging current or a charging voltage while a further temporal operating variable profile is captured and adjusting the parameter based on the further temporal operating variable profile.

8 Claims, 2 Drawing Sheets

(51) Int. Cl.
    *H01M 10/44*        (2006.01)
    *H02J 7/90*         (2026.01)

(52) U.S. Cl.
    CPC ........... *H01M 10/445* (2013.01); *H02J 7/927*
             (2026.01); *H01M 2010/4278* (2013.01)

(56)          References Cited

U.S. PATENT DOCUMENTS

| | | |
|---|---|---|
| 2016/0023567 A1 | 1/2016 | Lee |
| 2020/0150185 A1 | 5/2020 | Ramezan Pour Safaei et al. |
| 2024/0295605 A1* | 9/2024 | Bessler ................ G01R 31/374 |

FOREIGN PATENT DOCUMENTS

| | | |
|---|---|---|
| DE | 102017115766 A1 | 1/2019 |
| DE | 102019111979 A1 | 11/2020 |
| DE | 102020206592 A1 | 12/2021 |

* cited by examiner

METHOD AND DEVICE FOR ADJUSTING MODEL PARAMETERS OF AN ELECTROCHEMICAL BATTERY MODEL OF A DEVICE BATTERY DURING A CHARGING PROCESS

BACKGROUND OF THE INVENTION

The invention relates to methods for adjusting a parameterization of an electrochemical battery model of device batteries.

The supply of energy to network-independently operated electrical devices and machines, e.g., electrically drivable motor vehicles, generally takes place by means of device batteries or vehicle batteries. The latter supply electrical energy for operating the devices.

Device batteries degrade over their service life and depending on their load or usage. This so-called aging leads to a continuously decreasing maximum power or storage capacity. The aging state corresponds to a measure for indicating the aging of energy stores. In accordance with the convention, a new device battery may have a 100% aging state (with respect to its capacity, SOH-C) which increasingly decreases over the course of its service life. A measure of aging of the device battery (temporal change in the aging state) depends on an individual load on the device battery, i.e., in the case of vehicle batteries of motor vehicles, on the usage behavior of a driver, external ambient conditions and on the type of vehicle battery.

In order to monitor device batteries from a multitude of devices, operating variable data are generally continuously captured and are transmitted as operating variable profiles in blocks to an external central unit. In the case of device batteries comprising a multitude of battery cells, the operating variables can be captured at the cell level and transmitted to the central unit in compressed form. In order to evaluate the operating variable data, in particular to determine aging states in models based on differential equations, the operating variable data are sampled as profiles at a comparatively high temporal resolution (sampling rates) of, for example, between 1 and 100 Hz and an aging state is determined therefrom using a time integration method.

In order to evaluate the operating variable data, in particular to determine aging states, an electrochemical battery model is used, which is based on a differential equation system with a plurality of non-linear differential equations. The operating variable data allow battery states to be modeled using a time integration method. Such electrochemical battery models are known, for example, from the publications US 2016/023,566, US 2016/023,567 and US 2020/150,185.

The implementation in the central unit allows the use and adjustment of the electrochemical battery model for a multitude of device batteries comprising similar battery cells or comprising cells of similar cell chemistry. The calculation of the battery states using the differential equation system is computationally intensive so that outsourcing to the central unit can reduce the computational load in internal computing devices.

The electrochemical battery model is generally initially parameterized for a type of battery by the manufacturer on the basis of extensive laboratory measurements. However, it is not possible to perform all measurements with sufficient granularity and to take into account all dynamic dependencies. In particular, dependencies on high dynamics, i.e., a fast temporal change of load variables, can only be mapped with difficulty.

SUMMARY OF THE INVENTION

According to the invention, a method for adjusting model parameters of an electrochemical battery model of a device battery as well as a corresponding device are provided.

According to a first aspect, a method for adjusting at least one model parameter of an electrochemical battery model of a device battery of a technical device is provided, wherein the battery model is designed to indicate a relationship between operating variables of an operating variable profile depending on an internal battery state determined by model parameters, in particular for the purposes of functional monitoring, comprising the following steps:

providing a temporal operating variable profile of a plurality of operating variables for a particular time period;

modeling a profile of at least one of the operating variables using the battery model based on at least one operating variable of the provided operating variable profile within the time period;

determining one or more operating states of the device battery to be checked at points in time when a deviation of the at least one modeled operating variable from the corresponding operating variable of the operating variable profile provided, in particular by more than one threshold value, is determined during the time period;

performing a charging process, wherein, in the presence of the one or more operating states, a current pulse or a voltage pulse of a specified height and a specified duration is superimposed on a charging current or a charging voltage while a further temporal operating variable profile of the plurality of operating variables is captured;

adjusting the model parameters of the electrochemical battery model based on the further temporal operating variable profile.

The internal state of a device battery generally cannot be measured directly. This would require a number of sensors inside the device battery, which would make the production of such a device battery costly as well as complex and would increase the space requirement.

The monitoring of internal battery states of device batteries of a plurality of devices is therefore carried out in an external central unit for capacity-related reasons. For this purpose, the devices transmit temporal operating variable profiles of operating variables of the device batteries to the central unit, wherein a current electrochemical state and/or aging state is determined in the central unit. For this purpose, depending on the electrochemical battery model used, time series of operating variables are continuously captured as operating variable profiles, such as battery current, battery temperature, charging state, and/or battery voltage, and are transmitted to the central unit in blocks and, optionally, in compressed form. There, the operating variable profiles are evaluated so that a device-specific internal battery state and, optionally, further variables, e.g., an aging state, can be calculated/determined based on the electrochemical battery model. The evaluation can take place on the entire device battery, individual battery cells, or units of a plurality of battery cells.

In the case of device batteries, the aging state (state of health, SOH) is the key variable to indicate a remaining battery capacity or remaining battery charge. The aging state represents a measure of the aging of the device battery. In the case of a device battery or a battery module or a battery cell, the aging state may be indicated as a capacity retention rate (SOH-C). The capacity retention rate SOH-C, i.e., the capacity-related aging state, is given as the ratio of the measured instantaneous capacity to an initial capacity of the fully charged battery and decreases with increasing aging. Alternatively, the aging state may be given as an increase in internal resistance (SOH-R) with respect to internal resistance at the start of the service life of the device battery. The relative change in the internal resistance SOH-R increases with increasing aging of the battery.

Device batteries generally comprise a plurality of battery cells, which may be monitored separately. This can take place by simulating the states of the battery cells in a computing unit in the form of a "digital twin," in particular using a battery model known per se.

The electrochemical battery model comprises a differential equation system that models internal battery states, in particular equilibrium states, based on differential equations parameterized via model parameters and provides a relationship between operating variables of the battery cells of the device battery, namely a battery current, a battery voltage, a battery temperature, and a charging state of the device battery using a time integration approach. Model parameters of the battery model may be fitted using operating variable profiles of the battery cells within a limited time period, wherein electrochemical, kinetic model parameters can be derived, which can, e.g., comprise electrolyte concentrations, reaction rates, layer thicknesses, porosities, etc. The aging state of the respective battery cell can be determined as a linear combination of the model parameters and/or the internal states by approximation.

The electrochemical battery model can be adjusted for each of the battery cells based on operating variable profiles captured during rest phases within short time periods (a few minutes to a few hours). On the basis of the fitted electrochemical model parameters, internal battery states and/or the aging state can be determined.

An age-dependent no-load voltage characteristic curve can be calculated analytically via a batch algorithm so that by adjusting for the open-circuit voltage, detailed electrochemical model parameters of the electrochemical battery model can be directly inferred and the aging state of the battery cells can thus be determined directly.

The model parameters of the electrochemical battery model may be re-parameterized at regular intervals, in particular if sufficiently new data on measured charging states and battery variables are present. These data can be collected for similar device batteries by evaluation in a central unit, and the adjustment or re-parameterization can be performed there. The adjustment of the model parameters of the electrochemical battery model may take place by fitting the battery model to the available data, e.g., using a least square method or the like.

In particular, the monitoring serves to detect low-performing and/or vulnerable device batteries or battery cells and to prevent them from being overloaded during a charging process. Furthermore, in order to determine an aging state of the entire device battery, the cell aging states are determined and are offset against one another according to the topology or configuration of the device battery with respect to the arrangement and circuitry of the battery cells in order to determine the aging state for the entire device battery.

Since, in particular, the electrochemical battery model is only insufficiently parameterized after commissioning the device battery with regard to mapping the dynamic behavior thereof, it is provided to adjust model parameters of the electrochemical battery model, in particular with regard to the model parameters used to describe dynamic processes within the battery cells. These model parameters cannot all be determined by laboratory measurements and thus enter the calibration with the model parameters for the electrochemical battery model only in a rudimentary manner.

The model parameters relating to battery states during dynamic operation comprise, in particular, temperature-dependent diffusion parameters in the anode and cathode of the battery cells, a thickness of the SEI, an electrolyte concentration, an ionic conductivity, a volume fraction of the electrolyte, a lithium ion concentration, an ohmic resistance, and others.

The model parameters are regularly adjusted using new operating variable profiles from the active operation of the device battery. During the usual device use, the device batteries are generally loaded with frequently changing or varying discharge currents so that the resulting operating variable profiles are unsuitable for determining these dynamic model parameters. This is due to the fact that the history of the battery operation plays a decisive role for the parameterization, e.g., due to the relaxation behavior.

It is therefore advantageous to carry out the adjustment of the model parameters of the electrochemical battery model based on a steady operation of the device battery. If the previous load behavior of the device battery is known, the parameterization or the adjustment of the model parameters of the electrochemical battery model can thus be carried out more precisely.

Thus, during a charging process, the device battery is generally charged at a predetermined charging current or a predetermined charging voltage. This charging current or the charging voltage is generally constant for a predetermined duration so that the aforementioned dynamic model parameters can be adjusted in an improved manner by artificially generating semi-dynamic operating states. This takes place by generating a current pulse or voltage pulse during a charging process with a constant charging current or a constant charging voltage at predetermined operating states and superimposing it on the constant charging current or the constant charging voltage. This takes place at operating states that can be indicated by an aging state, a charging state, and a particular battery temperature, and for which there is insufficient model accuracy of the electrochemical battery model.

Furthermore, the profile of the battery voltage can be modeled depending on the profile of the battery current, wherein the one or more operating states of the device battery to be checked are determined at points in time when a deviation of the battery voltage from the corresponding battery voltage provided, in particular by more than one threshold value, is determined during the time period.

Operating states in which the electrochemical battery model is only insufficiently parameterized can be determined by monitoring the measured battery voltage, for example. Using the electrochemical battery model, a corresponding profile of the battery voltage, a profile of the charging state and a profile of the battery temperature can be modeled from profiles of the battery current. This can be compared to the profile of the measured battery voltage of the evaluated operating variable profile, and the operating states of the device battery can be determined with respect to the charging state and the battery temperature, at which a deviation over a specified threshold value can be determined. The battery states correspond to operating states in which the parameterization does not reflect a sufficiently accurate representation of the battery behavior.

It may be provided that the one or more operating states to be checked are determined by a charging state and a battery temperature.

In particular, upon detecting a too high deviation between the measured and modeled battery voltages, the charging state of the relevant device battery, the aging state, and the battery temperature are captured and used to define the operating state at which a measurement of the device battery during semi-dynamic operation is to be carried out.

In particular, during a subsequent charging process of the device battery under consideration, at a charging state corresponding to the previously determined charging state of the defined operating state and at a battery temperature substantially corresponding to the previously determined battery temperature, the current pulse or voltage pulse can be impressed onto the charging profile in order to simulate a semi-dynamic operating case of the device battery there. In this way, operating variable profiles are obtained, which are in particular suitable for adjusting the dynamic model parameters of the electrochemical battery model.

It may be provided that the method is performed in an external central unit that is communicatively connected to a multitude of device batteries and that provides the electrochemical battery model for all device batteries, wherein operating variable profiles of all device batteries are provided in the central unit, and the adjustment of the model parameters based on the further temporal operating variable profiles is performed in the central unit.

In particular, for the one or more operating states, the further operating variable profiles can be provided only by one or more of the device batteries whose aging states correspond to the aging state of the corresponding operating state to be checked.

BRIEF DESCRIPTION OF THE DRAWINGS

Embodiments are described in further detail below with reference to the accompanying drawings. The figures show.

DETAILED DESCRIPTION

In the following, the method according to the invention is described with reference to vehicle batteries as device batteries in a multitude of motor vehicles as similar devices. For this purpose, one or more aging state models are operated in the central unit and used for the aging calculation and, optionally, aging prediction. In the central unit, the electrochemical battery models are continuously updated or re-trained based on operating variable profiles of the vehicle batteries from the vehicle fleet.

The above example is representative of a plurality of stationary or mobile devices with a network-independent energy supply, such as vehicles (electric vehicles, pedelecs, etc.), systems, machine tools, household appliances, IOT devices, and the like, which are connected via a corresponding communication link (e.g., LAN, internet) to an external central unit (cloud).

Figure 1:
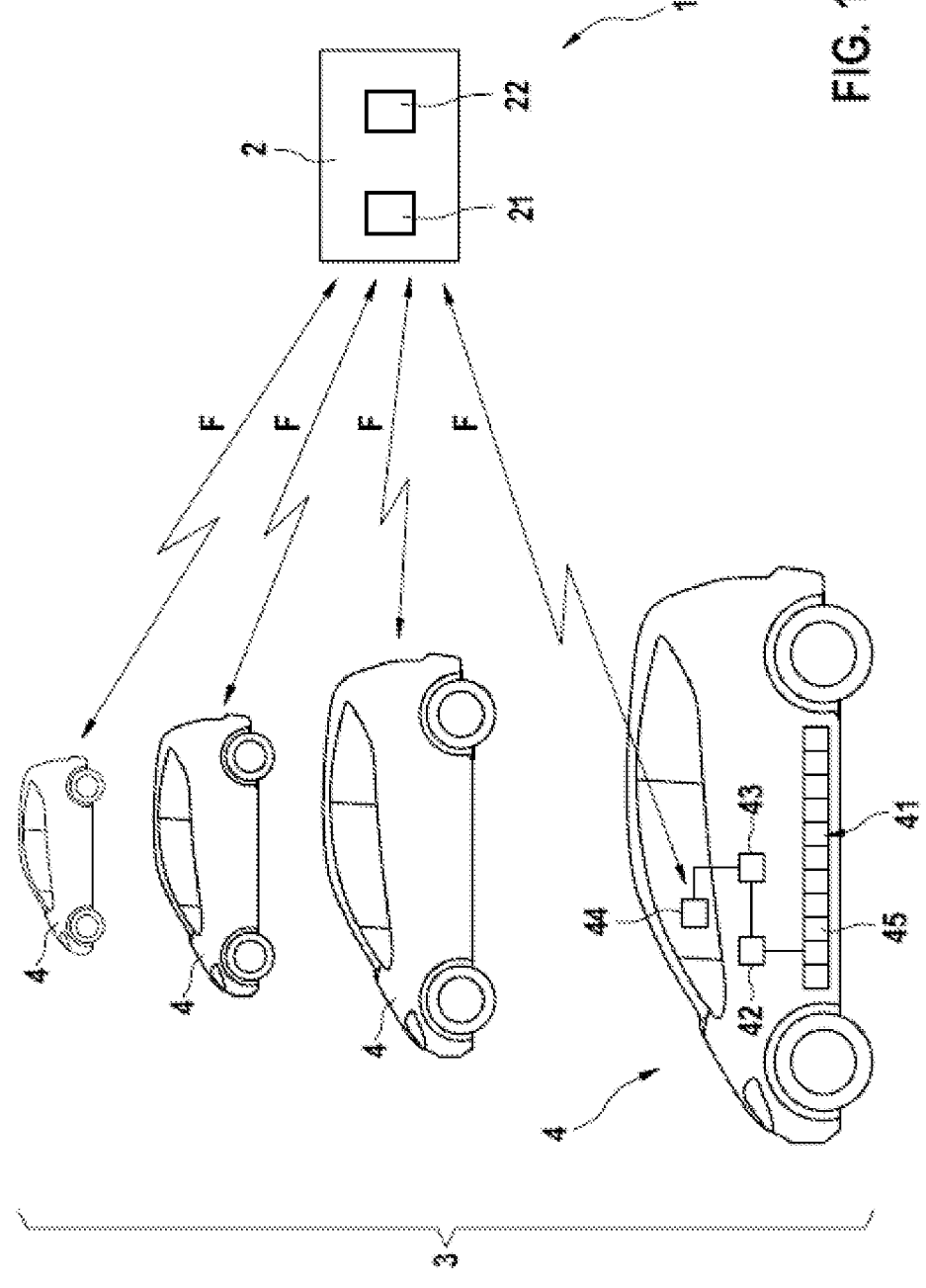
FIG. 1 a schematic illustration of a system for providing operating variable profiles of a vehicle battery for monitoring the vehicle battery in a central unit.

FIG. 1 shows a system 1 for collecting fleet data in a central unit 2 for creating, adjusting, and evaluating an electrochemical battery model for monitoring the battery state. The electrochemical battery model is used to determine an internal battery state of battery cells, a pack of a plurality of battery cells, or the entire vehicle battery in a motor vehicle. FIG. 1 shows a vehicle fleet 3 with a plurality of motor vehicles 4.

One of the motor vehicles 4 is shown in more detail in FIG. 1. The motor vehicles 4 each comprise a vehicle battery 41, an electric drive motor 42, and a control unit 43. The control unit 43 is connected to a communication device 44, which is suitable for transmitting data between the respective motor vehicle 4 and a central unit 2 (a so-called cloud).

The vehicle battery 41 comprises a plurality of battery cells 45 that are to be monitored with regard to battery state and, optionally, aging state according to methods described below.

The control unit 43 is in particular designed to capture data for selected, selectable, or all battery cells 45 at a high temporal resolution, such as between 1 and 50 Hz, e.g., 10 Hz, and to transmit them to the central unit 2 via the communication device 44.

The motor vehicles 4 send the central unit 2 the operating variables F, which indicate at least variables that affect the aging state of the vehicle battery 41 and that are required for a determination of the internal battery states of the battery cells 45. The operating variables F can indicate an instantaneous battery current, an instantaneous battery voltage, an instantaneous battery temperature, and an instantaneous charging state (SOC), at the pack level, module level, and/or cell level. The operating variables F are captured in a fast time grid from 0.1 Hz to 50 Hz as operating variable profiles and can be transmitted regularly to the central unit 2 in uncompressed and/or compressed form. For example, by using compression algorithms, the time series may be transmitted to the central unit 2 in blocks at intervals of 10 min to several hours in order to minimize the data traffic to the central unit 2.

The central unit 2 comprises a data processing unit 21, in which the method described below can be performed, and a database 22 for storing data points, model parameters, states, and the like.

An electrochemical battery model is implemented in the central unit 2, which model carries out a determination of the instantaneous internal battery state of the relevant vehicle battery 41 based on the temporal profiles of the operating variables and operating characteristics determined therefrom.

The central unit 2 is designed to receive the operating variable profiles and to model a digital twin for each vehicle 4 or each vehicle battery 41. For each battery cell 45, each pack of a plurality of battery cells, or the entire vehicle battery 41, the digital twin determines a current battery state using the electrochemical battery model.

Furthermore, an appropriate aging state model can be implemented in the central unit 2, which model determines an aging state (e.g., during a charging process) depending on the internal state of the vehicle battery or by considering particular operating situations.

The aging state (state of health, SOH) is the key variable to indicate a remaining battery capacity or remaining battery charge. The aging state represents a measure of the aging of the vehicle battery or of a battery module or of a battery cell and may be indicated as a capacity retention rate (SOH-C) or as an increase in internal resistance (SOH-R). The capacity retention rate SOH-C is given as the ratio of the measured instantaneous capacity to an initial capacity of the fully charged battery. The relative change in the internal resistance SOH-R increases with increasing aging of the battery.

The electrochemical battery model is a non-linear mathematical model which is based on differential equations and is evaluated using time integration. Evaluating the electrochemical battery model with operating variable profiles for a particular time period results in a modeled internal battery state of the equation system of the physical differential equations corresponding to a physical internal battery state of the vehicle battery 41. Since the electrochemical battery model is based on physical and electrochemical principles, the model parameters of the physical aging model are variables that indicate physical properties.

The time series of the operating variables F of the device battery 41 considered (in the case of total battery consideration) or of the cell operating variables of the battery cells (in the case of an individual consideration of the battery cells) thus directly enter the electrochemical battery model that models corresponding internal electrochemical states, such as layer thicknesses (e.g., SEI thickness), change in cyclable lithium due to anode/cathode side reactions, rapid consumption of electrolytes, slow consumption of electrolytes, loss of active material in anode, loss of active material in cathode, etc. . . . , using non-linear differential equations and a multi-dimensional state vector.

Depending on the operating variables F, the electrochemical battery model determines internal physical battery states from which an aging state SOH can, for example, be determined. The internal battery state may be mapped linearly or non-linearly to a capacity retention rate (SOH-C) and/or an internal resistance increase rate (SOH-R) as an indication of the aging state.

The electrochemical battery model can model equilibrium states and be described by model parameters. The model parameters can be re-parameterized at regular intervals, in particular if operating variable profiles at a high sampling rate for a defined time period of at least a few (e.g., three) hours are present. The electrochemical battery model can be fitted to the operating variable profiles, for example during rest phases, using, for example, a least square method or the like in order to adjust the model parameters of the battery model. These data can be collected for similar vehicle batteries 41 by evaluation in a central unit 2, and the adjustment or re-parameterization can be performed there.

Such model parameters of the battery model may comprise, for example, a scalar indication of the cyclable lithium (value refers to the cathode capacity), the proportion of the cyclable lithium at the start of the service life of the battery (scalar value), a volume fraction of the anode, and a volume fraction of the anode at the start of the service life of the vehicle battery 41.

For evaluating the electrochemical battery model, cell operating variable profiles are generally only necessary for a short time period, such as a few hours, in order to adjust model parameters that indicate an internal battery state from kinetic states and equilibrium states.

Figure 2:
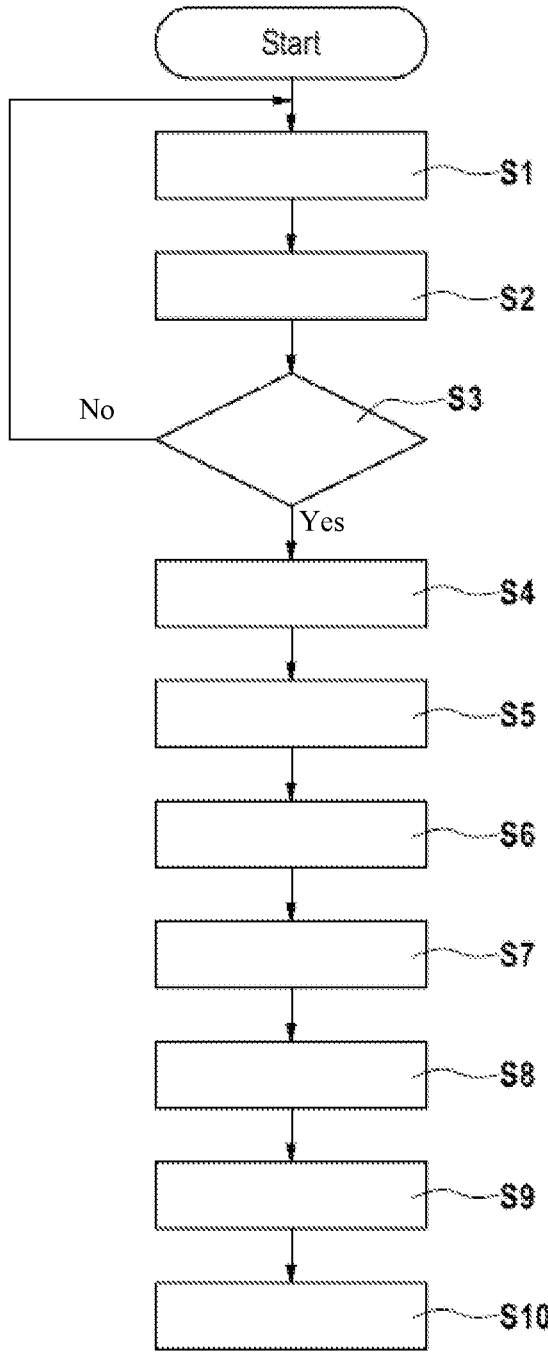
FIG. 2 a flow chart illustrating a method for adjusting model parameters of an electrochemical battery model that simulates the battery behavior of the vehicle battery in the central unit.

The adjustment of the model parameters of the electrochemical battery model implemented as an algorithm is described in more detail with reference to the flow chart of FIG. 2, the method performed in the central unit.

In step S1, operating variable profiles about the operation of the contained vehicle batteries 41 are first transmitted from all vehicles 4 of the vehicle fleet 3 to the central unit 2. The operating variable profiles correspond to temporal profiles of the operating variables, battery voltage, battery current, charging state, and battery temperature, for a specified time period of, e.g., several hours.

In step S2, at specified evaluation times, such as after several hours, daily, or weekly, the relevant operating variable profile for each of the vehicles 4 is checked as to the extent to which the electromechanical battery model implemented in the central unit 2 correctly maps the behavior of the relevant vehicle battery 41. For this purpose, the electrochemical battery model is evaluated using each of the operating variable profiles of the vehicles. The evaluation takes place by modeling a profile of the charging state, the battery voltage, and the battery temperature from, for example, a battery current profile, a battery temperature at the start of the specified time period of the operating variable profile and a battery voltage at the start of the specified time period of the operating variable profile.

In step S3, during the time period, the modeled battery voltage profile is compared to the measured battery voltage profile, which is likewise part of the operating variable profile received from the relevant vehicle. If a deviation of the modeled battery voltage from the measured battery voltage by more than a specified threshold value (alternative: Yes), which may be specified in absolute or relative terms, is detected within the considered operating variable profile at a point in time, an inaccurate electrochemical battery model is inferred and the method is continued with step S4. Otherwise (alternative: No), a jump back to step S1 occurs.

In step S4, for the one or more determined points in time within the relevant operating variable profile, the charging state of the vehicle battery, the aging state of the vehicle battery 41 are now determined as the operating states to be checked, using the aging state model and the battery temperature.

The aging state at the point(s) in time can be determined in a manner known per se, using a suitable aging state model, from the operating variable profiles or the internal battery states of the electrochemical battery model or by evaluation of particular battery states (Coulomb counting during the charging process).

In step S5, a request for parameterization measurement is sent to one or more selected vehicle batteries 41 to impress a current pulse or voltage pulse on the charging current or the charging voltage at a particular operating state during a charging process in order to be able to carry out a re-parameterization of the electrochemical battery model from the resulting operating variable profiles.

The transmission of the request comprises, for each of the operating states to be checked, a transmission of the charging state and the battery temperature while the selection of the vehicle batteries according to the aging state of the operating state to be checked is carried out. That is to say, the requested parameterization measurement takes place only in one or more of the vehicle batteries that have an aging state for which a range of insufficient parameterization of the electrochemical battery model has been determined.

In the vehicle batteries 41, in step S6, the current pulse or voltage pulse is impressed and the operating variable profiles are accordingly captured during a subsequent charging process as soon as the charging state specified by the operating point to be checked, and the specified battery temperature have been reached. The current pulse or the voltage pulse can have a predetermined duration of a few seconds to a few minutes, e.g., between 10 s and 1 min. The height of the current pulse or voltage pulse can be relative to the height of the charging current or the charging voltage, e.g., between 5% and 20% of the charging current or the charging voltage.

In step S7, one or more resulting further operating variable profiles are captured and transmitted to the central unit 2.

In step S8, the central unit 2 captures the one or more corresponding further operating variable profiles and performs a respective re-parameterization of the electrochemical battery model on the basis of the operating variable profiles obtained in this way, at specified evaluation times, wherein as a result of the current pulses or voltage pulses during the charging processes, operating variable profiles are present, which correspond to semi-dynamic states and which can serve to improve the parameterization of the electrochemical battery model.

The re-parameterization can be carried out by performing the parameterization for a multitude of vehicle batteries 41 separately in order to determine the corresponding parameters.

In step S9, the re-parameterized model parameters of the battery model are first temporarily stored and only updated if a validation using newly captured operating variable profiles for the previously determined operating points to be checked results in no deviation of the modeled battery voltage from the measured battery voltage by more than the specified threshold value. In particular, the update can also be carried out only if the adjusted model parameters for a number of vehicles result above a specified minimum number. It may be provided that an adjustment of the model parameters of the battery model is performed on the basis of the re-parameterized model parameters only if the absolute deviation is below a respective specified threshold value.

In step S10, the model parameters of the electrochemical battery model validated in this manner are provided to the vehicles 4 in order to be able to monitor the battery function or the battery behavior in the vehicles using the electrochemical battery model.

The invention claimed is:

1. A method for adjusting at least one model parameter of an electrochemical battery model of a device battery (41) of a technical device, wherein the electrochemical battery model is designed to indicate a relationship between operating variables of an operating variable profile depending on an internal battery state determined by model parameters for the purposes of functional monitoring of the battery device (41), comprising the following steps:

providing (S1) a temporal operating variable profile of a plurality of operating variables for a time period;

modeling (S2) a profile of at least one of the operating variables using the electrochemical battery model based on at least one operating variable of the provided operating variable profile within the time period;

determining (S3) one or more operating states of the device battery to be checked at times when a deviation of the at least one modeled operating variable from the corresponding operating variable of the operating variable profile provided by more than one threshold value, is determined during the time period, performing (S6) a charging process with a constant charging current or a constant charging voltage, wherein, in the presence of the one or more operating states, a transient current pulse or a transient voltage pulse of a specified height and a specified duration is superimposed on the constant charging current or the constant charging voltage while a further temporal operating variable profile of the plurality of operating variables is captured, wherein the further temporal operating variable profile simulates a semi-dynamic operation of the device battery; and adjusting (S8) the at least one model parameter of the electrochemical battery model based on the further temporal operating variable profile.

2. The method according to claim 1, wherein the one or more operating states to be checked are determined by a charging state and a battery temperature.

3. The method according to claim 1, wherein the method is performed in an external central unit (2) that is communicatively connected to control units (43) of a multitude of device batteries (41) and that provides the electrochemical battery model for all device batteries (41), wherein operating variable profiles of all device batteries (41) are provided in the central unit (2), and the adjustment of the model parameters based on the one or more further temporal operating variable profiles is performed in the central unit (2).

4. The method according to claim 3, wherein the at least one adjusted model parameter of the electrochemical battery model is transmitted to the control units (43) of the device batteries for use in a battery model implemented there.

5. The method according to claim 3, wherein the one or more operating states to be checked are determined by a charging state, an aging state, and a battery temperature, wherein for the one or more operating states, the further operating variable profiles are provided only by one or more of the device batteries (41) whose aging states correspond to the aging state of the corresponding operating state to be checked.

6. The method according to claim 1, wherein the operating variables of the operating variable profile comprise a battery current, a battery voltage, a charging state, and a battery temperature, wherein the profile of the battery voltage is modeled depending on the profile of the battery current, wherein the one or more operating states of the device battery (41) to be checked are determined at points in times when a deviation of the battery voltage from the corresponding battery voltage provided by more than one threshold value, is determined during the time period.

7. An apparatus comprising a data processing device configured to:

provide (S1) a temporal operating variable profile of a plurality of operating variables for a time period;

model (S2) a profile of at least one of the operating variables using an electrochemical battery model of a device battery (41) based on at least one operating variable of the provided operating variable profile within the time period, wherein the electrochemical battery model is designed to indicate a relationship between operating variables of an operating variable profile depending on an internal battery state determined by model parameters for the purposes of functional monitoring of the battery device (41);

determine (S3) one or more operating states of the device battery to be checked at times when a deviation of the at least one modeled operating variable from the corresponding operating variable of the operating variable profile provided by more than one threshold value, is determined during the time period;

perform (S6) a charging process with a constant charging current or a constant charging voltage, wherein, in the presence of the one or more operating states, a transient current pulse or a transient voltage pulse of a specified height and a specified duration is superimposed on the constant charging current or the constant charging voltage while a further temporal operating variable profile of the plurality of operating variables is captured, wherein the further temporal operating variable profile simulates a semi-dynamic operation of the device battery; and adjust (S8) the at least one model parameter of the electrochemical battery model based on the further temporal operating variable profile.

8. A non-transitory computer-readable medium including instructions executable by a data processing device to perform a set of functions, the set of functions comprising:

providing (S1) a temporal operating variable profile of a plurality of operating variables for a time period;

modeling (S2) a profile of at least one of the operating variables using an electrochemical battery model of a device battery (41) based on at least one operating variable of the provided operating variable profile within the time period, wherein the electrochemical battery model is designed to indicate a relationship between operating variables of an operating variable profile depending on an internal battery state determined by model parameters for the purposes of functional monitoring of the battery device (41);

determining (S3) one or more operating states of the device battery to be checked, at times when a deviation of the at least one modeled operating variable from the corresponding operating variable of the operating variable profile provided by more than one threshold value, is determined during the time period;

performing (S6) a charging process with a constant charging current or a constant charging voltage, wherein, in the presence of the one or more operating states, a transient current pulse or a transient voltage pulse of a specified height and a specified duration is superimposed on the constant charging current or the constant charging voltage while a further temporal operating variable profile of the plurality of operating variables is captured, wherein the further temporal operating variable profile simulates a semi-dynamic operation of the device battery; and adjusting (S8) the at least one model parameter of the electrochemical battery model based on the further temporal operating variable profile.

* * * * *